United States Patent
Liang

(10) Patent No.: US 7,277,301 B2
(45) Date of Patent: Oct. 2, 2007

(54) ELECTRONIC DEVICE WITH SHIELD

(75) Inventor: Jen-Yu Liang, Tu Cheng (TW)

(73) Assignee: Hon Hai Precision Industry Co., LTD., Tu-Cheng, Taipei Hsien (TW)

(*) Notice: Subject to any disclaimer, the term of this patent is extended or adjusted under 35 U.S.C. 154(b) by 0 days.

(21) Appl. No.: 11/308,749

(22) Filed: Apr. 28, 2006

(65) Prior Publication Data

US 2007/0103882 A1 May 10, 2007

(30) Foreign Application Priority Data

Nov. 4, 2005 (TW) .................................. 94219154

(51) Int. Cl.
*H05K 9/00* (2006.01)
(52) U.S. Cl. .................. 361/816; 361/800; 361/818; 361/753; 361/799; 174/350
(58) Field of Classification Search ................ 361/818, 361/753, 799, 800, 816; 174/35 GC, 350, 174/351; 439/607
See application file for complete search history.

(56) References Cited

U.S. PATENT DOCUMENTS

| 4,218,578 | A | * | 8/1980 | Olschewski et al. | ........ 174/372 |
|---|---|---|---|---|---|
| 4,816,613 | A | * | 3/1989 | Ito et al. | ...................... 174/372 |
| 5,508,889 | A | * | 4/1996 | Ii | ................................ 361/816 |
| 5,608,188 | A | * | 3/1997 | Choon et al. | ............... 174/372 |
| 5,907,478 | A | * | 5/1999 | Watanabe | .................... 361/807 |
| 6,178,097 | B1 | | 1/2001 | Hauk | |
| 6,420,649 | B1 | * | 7/2002 | Kahl et al. | ................... 174/377 |
| 6,593,523 | B2 | * | 7/2003 | Okada et al. | ............... 174/377 |
| 6,781,851 | B2 | * | 8/2004 | Daoud et al. | ............... 361/818 |
| 6,872,880 | B2 | * | 3/2005 | King et al. | .................. 174/372 |
| 6,979,773 | B2 | * | 12/2005 | Fursich | ........................ 174/377 |
| 7,113,410 | B2 | * | 9/2006 | Pawlenko et al. | .......... 361/818 |
| 2002/0057560 | A1 | * | 5/2002 | Okada | ......................... 361/818 |
| 2003/0223213 | A1 | * | 12/2003 | Daoud et al. | ............... 361/818 |

* cited by examiner

*Primary Examiner*—Dean A. Reichard
*Assistant Examiner*—Dameon E. Levi
(74) *Attorney, Agent, or Firm*—Wei Te Chung

(57) ABSTRACT

An electronic device includes a circuit board (20) and a shielding cove (10). The circuit board includes a plurality of mounting holes (26), a first surface (22), a second surface (24) opposite to the first surface, and at least one electronic component (28). The shield includes a top wall (12), a pair of first sidewalls (14) and a pair of second sidewalls (16) opposite to the first sidewalls. The top wall, the first sidewalls and the second sidewalls cooperatively bound a receiving portion (18) for receiving the electronic component. At least one mounting portion (162) extends from each of the second sidewalls, corresponding to the mounting holes of the circuit board.

8 Claims, 7 Drawing Sheets

ELECTRONIC DEVICE WITH SHIELD

FIELD OF THE INVENTION

The present invention relates to electronic devices, and particularly to an electronic device with a shield having mounting portions.

DESCRIPTION OF RELATED ART

EMI occurs between neighboring electronic components or circuits due to inductive coupling therebetween. EMI sources include inverters, diodes, transistors, amplifiers, power supplies, and other circuits of electronic devices. The effective performance of electronic devices can be interrupted, obstructed, or degraded by EMI. One popular solution developed to avoid the occurrence of EMI is to employ a metal shield to absorb as much EMI radiation energy as possible.

A conventional EMI shield 60 is shown in FIG. 7. The shield 60 comprises a top wall 62 and four sidewalls 64. In assembly, the sidewalls 64 of the shield 60 are soldered on a circuit board 50 via soldering tins. However, the shield 60 cannot be disengaged from the circuit board 50 once the shield 60 is mounted on the circuit board 50. Thus, an electronic component mounted on the circuit board 50 cannot be removed for maintenance or to be replaced. In addition, soldering tins are used during assembly of the shield 60 and the circuit board 50, resulting in the pollution of the environment.

Therefore, a heretofore unaddressed need exists in the industry to overcome the aforementioned deficiencies and inadequacies.

SUMMARY OF THE INVENTION

In an exemplary embodiment, an electronic device includes a circuit board and a shield. The circuit board includes a plurality of mounting holes, a first surface, a second surface opposite to the first surface, and at least one electronic component. The shield includes a top wall, a pair of first sidewalls, and a pair of second sidewalls opposite to the first sidewalls. The top wall, the first sidewalls, and the second sidewalls cooperatively bound a receiving portion for receiving the electronic component. At least one mounting portion extends from each of the second sidewalls corresponding to the mounting holes of the circuit board.

Other advantages and novel features will become more apparent from the following detailed description of preferred embodiments when taken in conjunction with the accompanying drawings, in which:

DETAILED DESCRIPTION OF THE INVENTION

Figure 1:
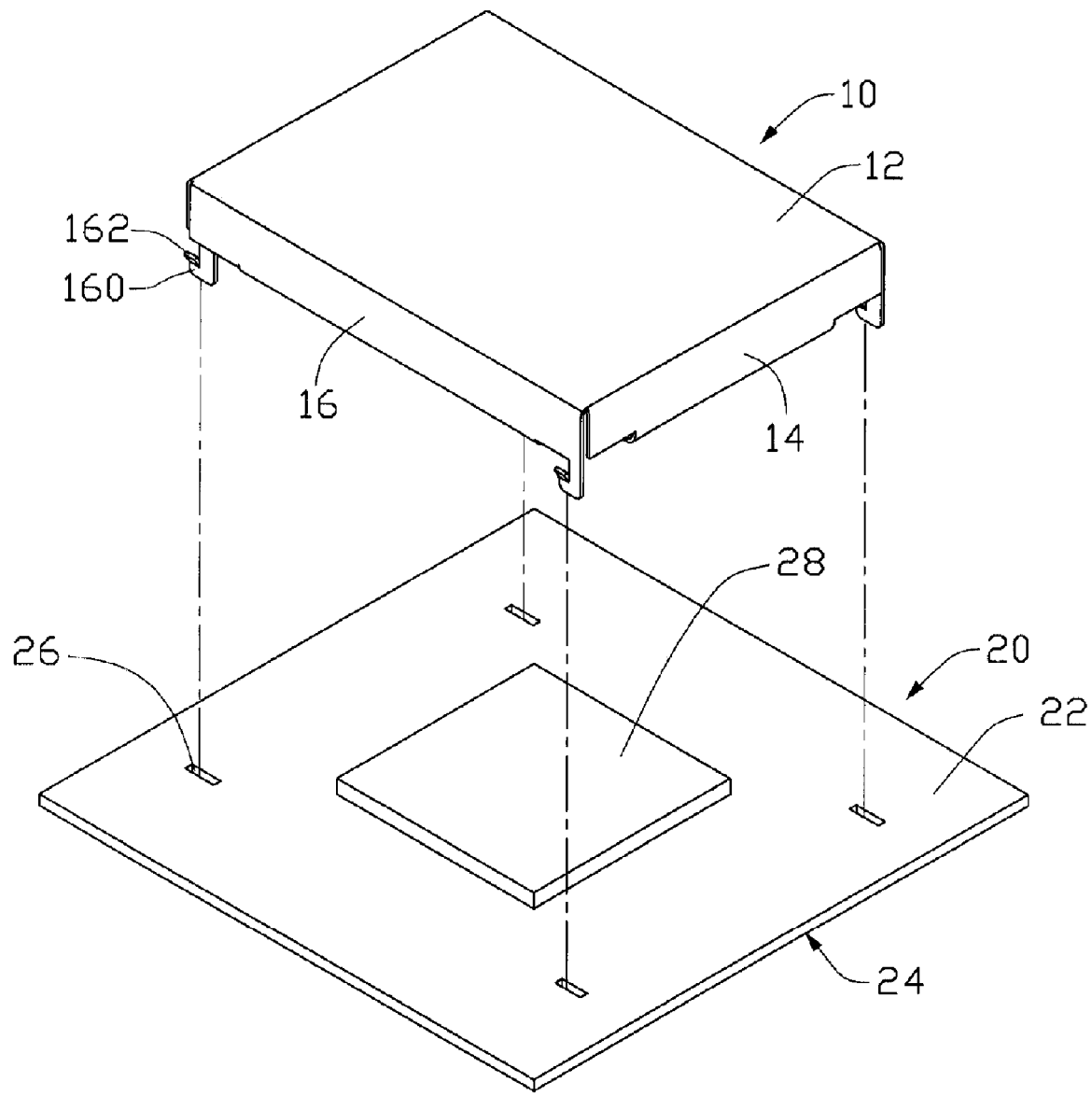
FIG. 1 is an exploded, isometric view of an electronic device in accordance with a first embodiment of the present invention, the electronic device comprising a shield and a circuit board.

FIG. 1 is an exploded, isometric view of an electronic device in accordance with a first embodiment of the present invention. The electronic device comprises a shield 10 and a circuit board 20.

The circuit board 20 comprises a first face 22, a second face 24 opposite to the first face 22, a plurality of mounting holes 26, and an electronic component 28. Each mounting hole 26 is rectangular, and extends from the first face 22 to the second face 24. In the embodiment, there are four mounting holes 26.

Figure 2:
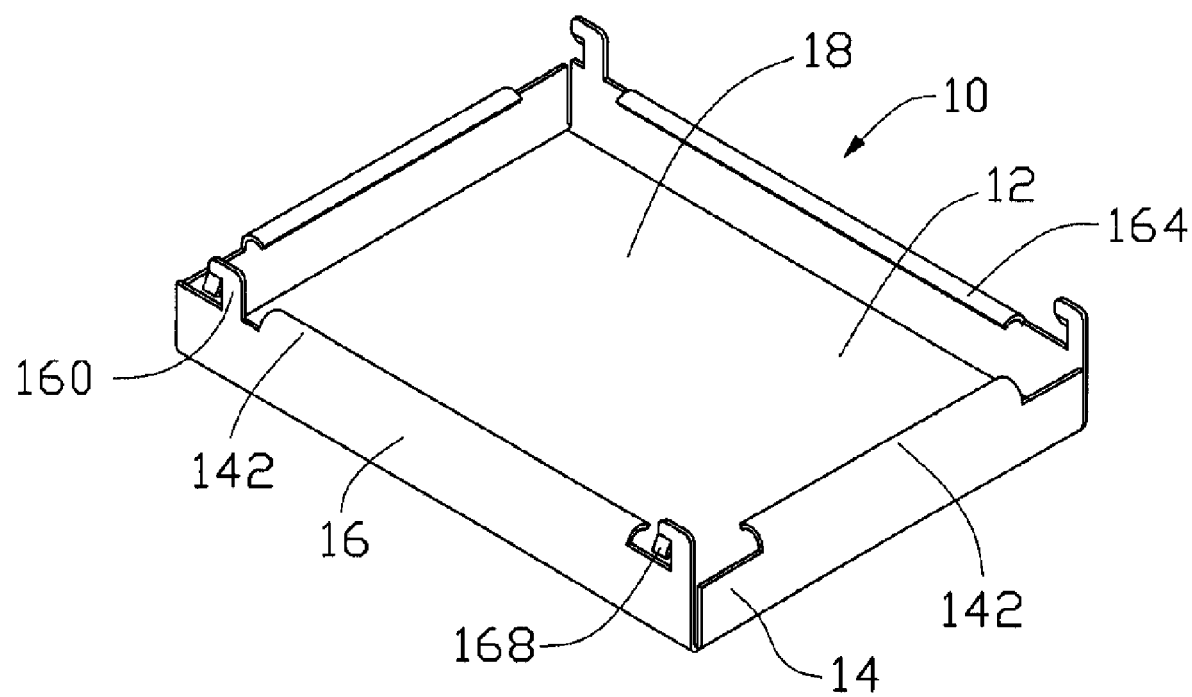
FIG. 2 is an isometric, inverted view of the shield of FIG. 1.
Figure 3:
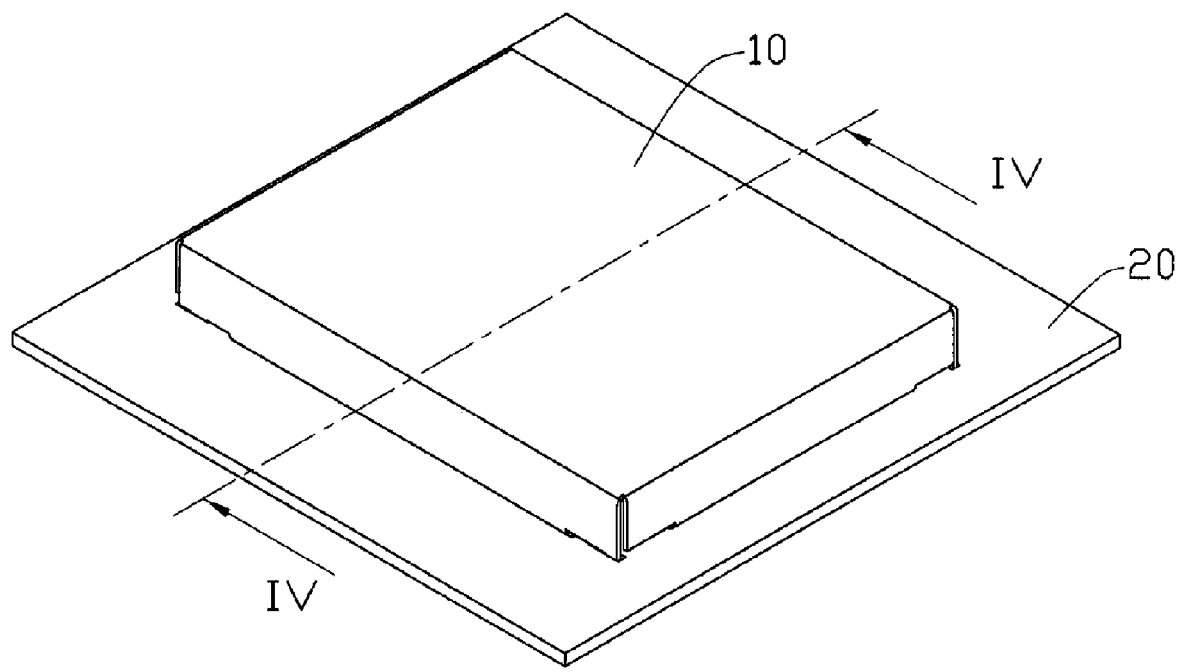
FIG. 3 is an assembled view of FIG. 1.
Figure 4:
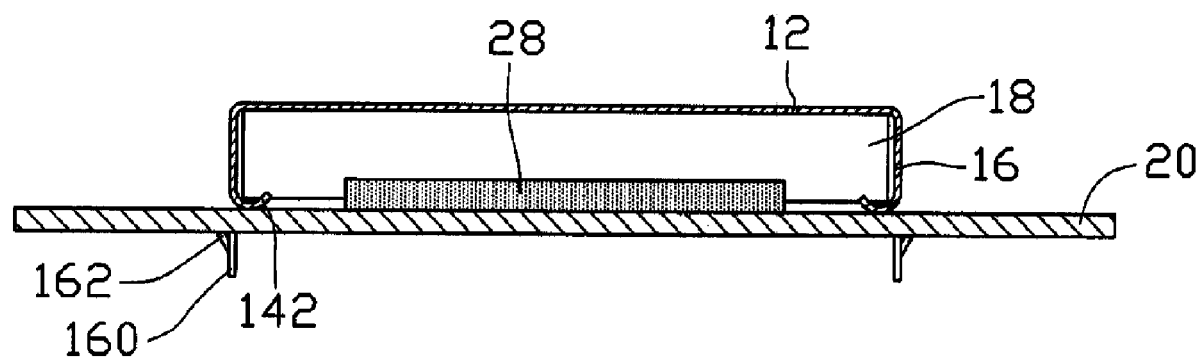
FIG. 4 is a cross-sectional view taken along line IV-IV of FIG. 3.

Referring also to FIG. 2, the shield 10 comprises a top wall 12, a pair of opposite first sidewalls 14, and a pair of opposite second sidewalls 16. Each of the first sidewal is 14 is connected perpendicularly to each of the second sidewalls 16. The first and second sidewalls 14, 16 are connected perpendicularly to the top wall 12, respectively. The top wall 12, and the first and second sidewalls 14, 16 cooperatively surround a receiving portion 18. The electronic component 28 is received in the receiving portion 18. Each first sidewall 14 comprises a resilient portion 142 extending from a distal end thereof and bent toward the receiving portion 18. Each second sidewall 16 comprises a pair of mounting portions 160 each received in the corresponding mounting hole 26 and depending from an end thereof adjacent to the first sidewall 14, and a resilient portion 164. Each mounting portion 160 comprises a hook (not labeled) and a protruding member 162 angularly extending from a distal end of the hook and extending backward relative to the receiving portion 18. The hook and the protruding member 162 are non-coplanar. Each protruding member 162 comprises a slope 168. As an alternative, each resilient portion 142 or 164 extends from a distal end of the first sidewall 14 or the second sidewall 16 and is bent back relative to the receiving portion 18.

Referring to FIGS. 1-4, in assembly, the mounting portions 160 of the shield 10 are received in the mounting holes 26 of the circuit board 20 with the protruding members 162 of the mounting portions 160 each passing through the corresponding mounting hole 26 and securely contacting the second surface 24 of the circuit board 20. Meanwhile, the resilient portions 142, 164 abut against the first surface 22 of the circuit board 20. Thus, the shield 10 and the circuit board 20 are assembled into an assembly. In this position, the resilient portions 142, 164 deform resiliently so that the resilient portions 142, 164 closely engage with a ground of the circuit board 20. This enforces an effect of the shield 10 in preventing electromagnetic interference (EMI).

In disassembly, the protruding member 162 of the mounting portion 160 is pushed in until it is deformably received in the mounting hole 26, so that the shield 10 is disengaged from the circuit board 20. That is, assembling or disassembling of the shield 10 and the circuit board 20 are simple. Therefore, it is convenient to remove the electrical component 28 of the circuit board 20 for maintenance or replacement.

Because the shield 10 is directly assembled to the circuit board 20 via the protruding member 162 of the shield 10, there is no soldering during the assembling or disassembling the shield 10 and the circuit board 20.

Because the protruding members 162 of the shield 10 securely contact the second surface 24 of the circuit board 20, the shield 10 can not be accidentally disengaged from the circuit board 20 during use.

Because of the slope 168 of each of the protruding members 162, the protruding members 162 can easily pass through the mounting hole 26 of the circuit board 20. Therefore, the shield 10 can be easily mounted to the circuit board 20.

Figure 5:
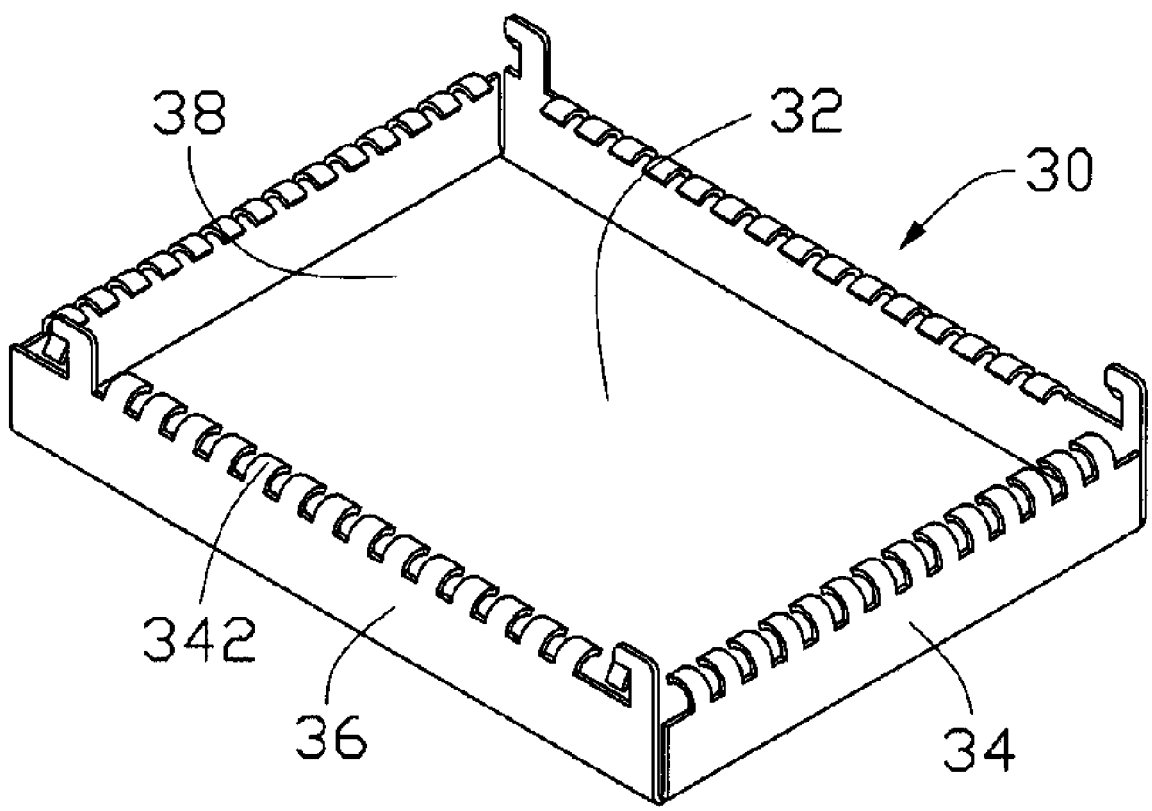
FIG. 5 is an isometric, inverted view of a shield in accordance with a second embodiment of the present invention.

FIG. 5 discloses a shield 30 in accordance with a second embodiment of the present invention. The shield 30 has a structure similar to that of the shield 10. The shield 30 comprises a pair of first sidewalls 34, a pair of second sidewalls 36, and a top wall 32. A plurality of resilient portions 342 extends from a distal end of each of the first sidewalls 34 or the second sidewalls 36, bent toward a receiving portion 38 bounded by the first and second sidewalls 34, 36 and the top wall 32. The shield 30 can perform substantially the same functions as the shield 10 described above.

Figure 6:
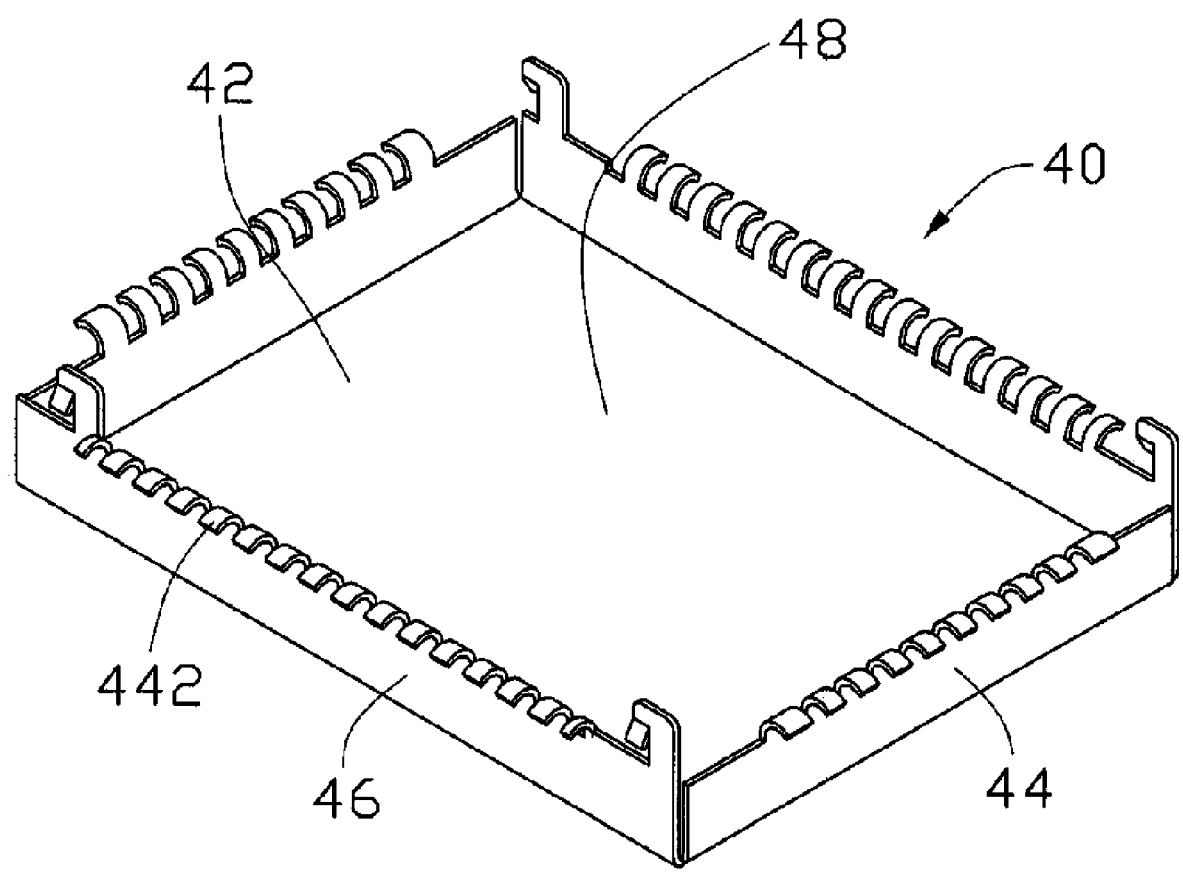
FIG. 6 is an isometric, inverted view of a shield in accordance with a third embodiment of the present invention.
Figure 7:
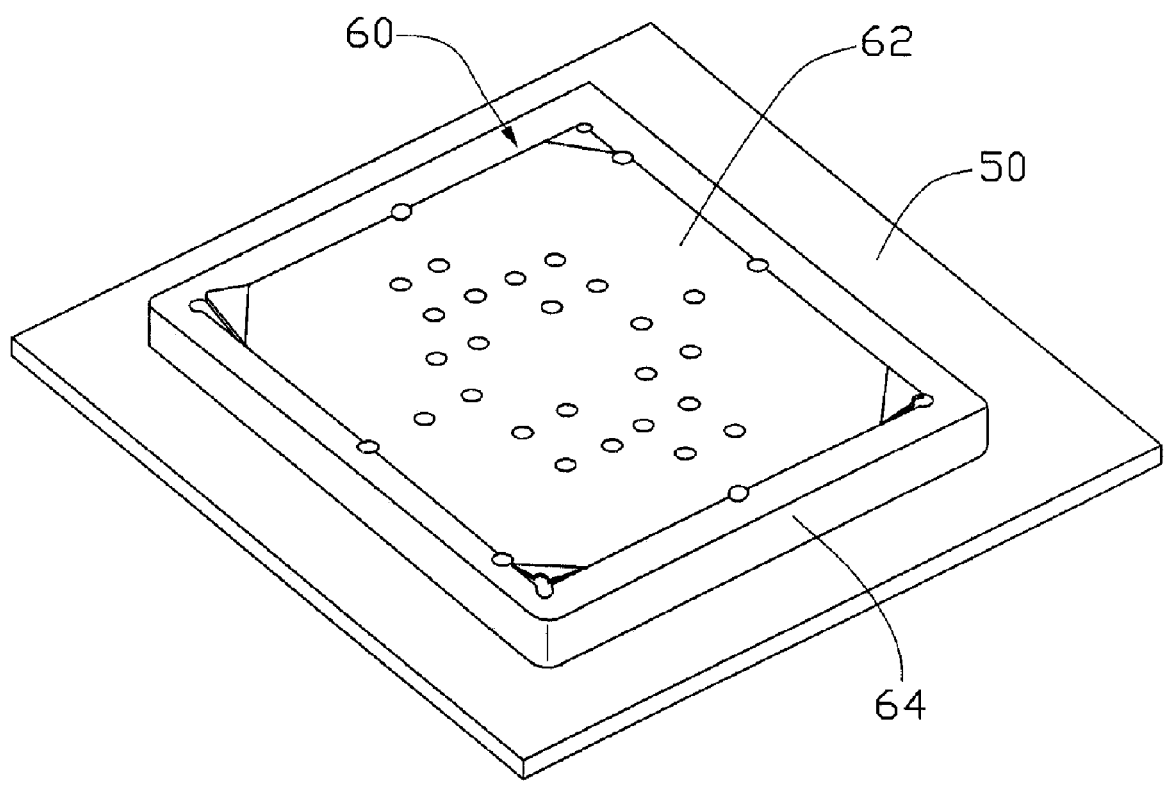
FIG. 7 is an isometric view of a conventional EMI shield used in electronic devices.

FIG. 6 discloses a shield 40 in accordance with another alternative embodiment of the present invention. The shield 40 has a structure similar to that of the shield 10. The shield 40 comprises a pair of first sidewalls 44, a pair of second sidewalls 46, and a top wall 42. The first and second sidewalls 44, 46 and the top wall 42 cooperatively bound a receiving portion 48. A plurality of resilient portions 442 extends from a distal end of each of the first sidewalls 44 and the second sidewalls 46, and is bent back relative to a receiving portion 48. The shield 40 can perform substantially the same functions as the shield 10 described above.

While exemplary embodiments have been described above, it should be understood that they have been presented by way of example only and not by way of limitation. Thus the breadth and scope of the present invention should not be limited by the above-described exemplary embodiments, but should be defined only in accordance with the following claims and their equivalents.

What is claimed is:

1. An electronic device comprising:
    a circuit board comprising a plurality of mounting holes, a first surface, a second surface opposite to the first surface, and at least one electronic component; and
    a shield comprising a top wall, a pair of first sidewalls, and a pair of second sidewalls opposite to the first sidewalls, the top wall, the first sidewalls, and the second sidewalls cooperatively bounding a receiving portion for receiving the electronic component, at least one mounting portion extending from each of the second sidewalls corresponding to the mounting holes of the circuit board, each of the mounting portions fixed to the circuit board mechanically, and comprising a hook and a protruding member upwardly extending from a distal end of the hook, the protruding member comprising a slope;
    wherein the protruding member and the hook are non-coplanar; and wherein each of the first and second sidewalls comprises at least one resilient portion extending from a distal end thereof bent aside relative to the receiving portion.

2. The electronic device as claimed in claim 1, wherein when the shield is mounted to the circuit board, the protruding member securely contacts the second surface of the circuit board.

3. The electronic device as claimed in claim 1, wherein the at least one mounting portion is two mounting portions, and the mounting portions are disposed at opposite ends of each of the second sidewalls and adjacent to the first sidewalls.

4. The electronic device as claimed in claim 1, wherein the at least one resilient portion is a plurality of resilient portions.

5. The electronic device as claimed in claim 4, wherein each of the resilient portions bends toward the receiving portion.

6. The electronic device as claimed in claim 4, wherein each of the resilient portions bends back relative to the receiving portion.

7. The electronic device as claimed in claim 1, wherein the protruding member bends angularly backward relative to the receiving portion.

8. An electronic device comprising:
    a circuit board comprising a first surface, a second surface opposite to said first surface, a plurality of mounting holes extending between said first and second surfaces and at least one electronic component disposed on said first surface; and
    a shield adapted to place at said first surface around said at least one electronic component, said shield comprising a plurality of walls to cooperatively bound a receiving portion for receiving said at least one electronic component therein at said first surface, at least one mounting portion extending from at least one of said plurality of walls corresponding to said plurality of mounting holes of said circuit board, each of said at least one mounting portion extending toward said circuit board and through one of said plurality of mounting holes from said first surface of said circuit board to and beyond said second surface of said circuit board, said each of said at least one mounting portion comprising a protruding member reversely extending from a distal end of said each of said at least one mounting portion along a direction defined from said second surface of said circuit board to said first surface of said circuit board so as to be able to engage with said second surface around said one of said plurality of mounting holes when said each of said at least one mounting portion extends through said one of said plurality of mounting holes; wherein said protruding member and the rest of said each of said at least one mounting portion are non-coplanar.

* * * * *